United States Patent [19]
Miyauchi et al.

[11] Patent Number: 4,581,628
[45] Date of Patent: Apr. 8, 1986

[54] CIRCUIT PROGRAMMING BY USE OF AN ELECTRICALLY CONDUCTIVE LIGHT SHIELD

[75] Inventors: Tateoki Miyauchi; Mikio Hongo; Masao Mitani, all of Yokohamashi; Isao Tanabe, Higashiyamatoshi; Toshiaki Masuhara, Tokyo, all of Japan

[73] Assignee: Hitachi, Ltd., Tokyo, Japan

[21] Appl. No.: 424,370

[22] Filed: Sep. 27, 1982

[30] Foreign Application Priority Data

Sep. 30, 1981 [JP] Japan .................. 56-153695

[51] Int. Cl.$^4$ .................. H01L 23/48; H01L 29/04
[52] U.S. Cl. .................. 357/71; 357/51; 357/84; 219/121 LM
[58] Field of Search .................. 365/96; 357/71, 84, 357/51; 219/121 LM; 29/575

[56] References Cited

U.S. PATENT DOCUMENTS

| | | | |
|---|---|---|---|
| 3,771,026 | 11/1973 | Asai et al. | 357/59 |
| 3,792,319 | 2/1974 | Tsang | 357/59 |
| 4,228,451 | 10/1980 | Priel et al. | 357/51 |
| 4,261,004 | 4/1981 | Masuhara et al. | 357/59 |
| 4,272,775 | 6/1981 | Compton | 357/51 |
| 4,455,495 | 6/1984 | Masuhara et al. | 357/51 |

Primary Examiner—William D. Larkins
Assistant Examiner—Charles S. Small, Jr.
Attorney, Agent, or Firm—Antonelli, Terry & Wands

[57] ABSTRACT

The present invention consists in a semiconductor integrated circuit device characterized in that a circuit programming wiring layer is formed on an insulating film which is provided on a semiconductor substrate, and that a light shielding protective mask material is deposited around the circuit programming wiring layer except a program part thereof, through an insulating film.

3 Claims, 14 Drawing Figures

FIG. 3(a)
PRIOR ART
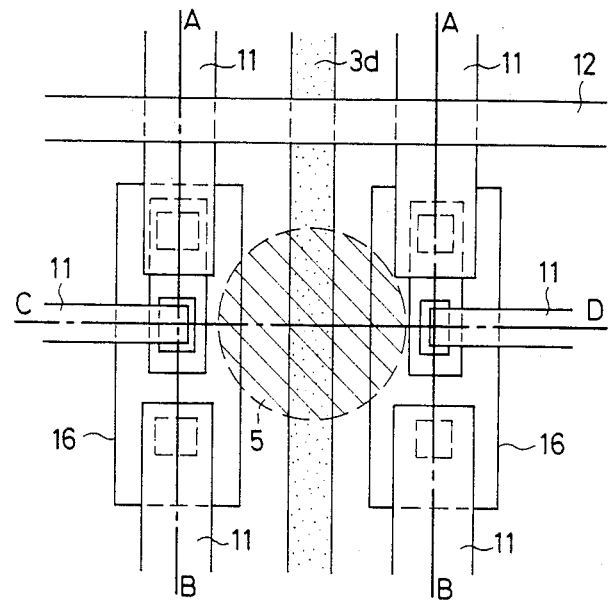
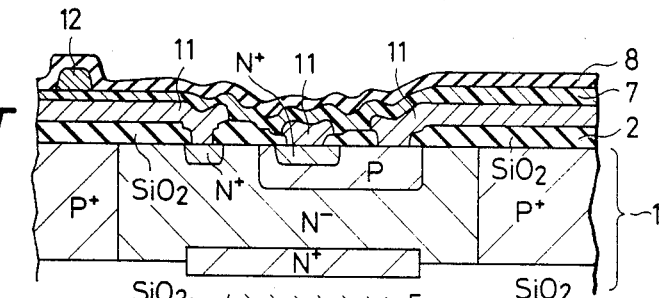
FIG. 3(b)
PRIOR ART
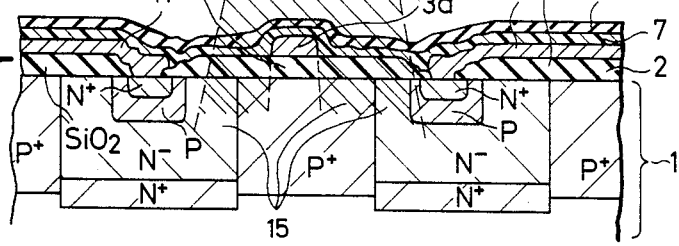
FIG. 3(a)
PRIOR ART FIG. 5(a)
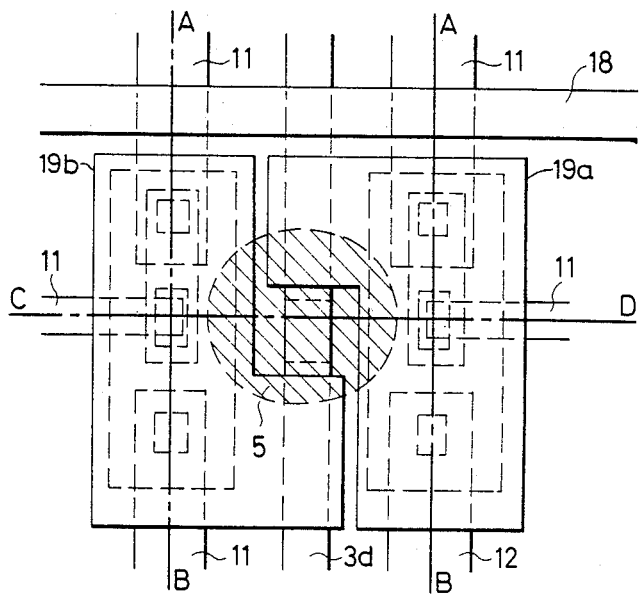
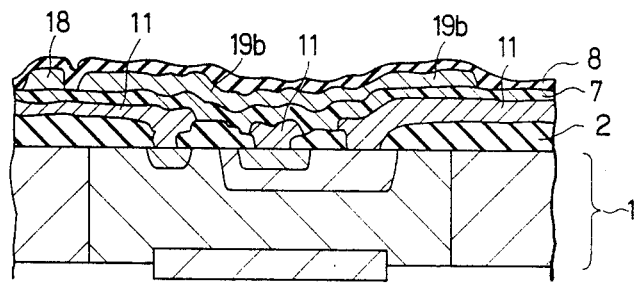
FIG. 5(b)
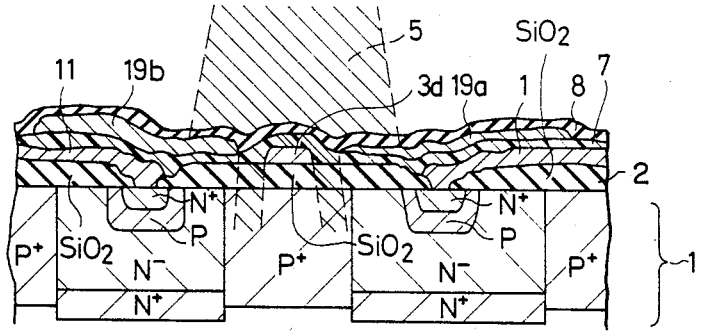
FIG. 5(c)

CIRCUIT PROGRAMMING BY USE OF AN ELECTRICALLY CONDUCTIVE LIGHT SHIELD

BACKGROUND OF THE INVENTION

The present invention relates to a programmable semiconductor integrated circuit, and more particularly to a semiconductor integrated circuit device which includes within its circuit wiring, wiring for programming and a laser masking pattern for realizing high productivity without requiring a high precision in laser irradiation for the programming.

An integrated circuit chip already manufactured can be programmed by disconnecting or short-circuiting parts of the wiring of the integrated circuit. This programming method has heretofore been used for, e.g., the programming of a read-only memory (ROM). In addition, it is recently utilized for the repair of defective cells in a memory device. These prior-art measures have usually employed the following expedients:

(1) A fuse is blown out by current, thereby to cut a wiring lead.

(2) Energy is externally applied optically by laser pulses, thereby to cut or connect a wiring lead.

FIGS. 1(a) and 1(b) show an example of the prior art. It is a programming method wherein a wiring lead 3 of polycrystalline Si or Al which is electrically insulated from an Si substrate 1 by an SiO$_2$ film 2 is cut by irradiating it with a laser beam 5 through an overlying passivation film 4. As an example of this method, R. P. Cenker et al. (1979 ISSCC Digest of Technical Papers) have reported the result of an experiment in which the wiring of decoders in a MOS memory was so altered that the defective cells of the memory connected to the decoders were separated and replaced with non-defective cells connected to dummy decoders.

However, the method in which the elements are disconnected in this manner has the following disadvantages:

(1) The energy of the laser needs to be high. Moreover, during the cutting, material 6 in or around the molten and scattered wiring part damages the nearby passivation film 4 as illustrated in FIG. 1(b), or the laser beam 5 is prone to damage the substrate near by. Therefore, the layout requires a sufficient margin and results in a large area.

(2) Even with the large area, a satisfactorily high positional accuracy such as ±1 μm for a 3 μm pattern is needed for preventing any influence on the surrounding part in the case of the laser irradiation of the part to-be-cut. In order to perform processing at high speed for mass production, it is required of the processing apparatus to simultaneously meet the mutually contradictory specifications of high speed and high accuracy. Even when such a processing apparatus can be realized, it becomes very expensive. Moreover, from the standpoint of reliability, it is difficult to locate a function element around the part to-be-cut.

(3) It is insufficient to use only the expedient of cutting. The use of short-circuiting is sometimes advantageous on the occupying area of a chip.

FIGS. 2(a) and 2(b) show another example of the prior art. There has been proposed the technique wherein a high-resistivity polycrystalline Si wiring lead (resistance $\approx 10^9 \Omega$) 3b, which is electrically insulated from an Si substrate 1 by an SiO$_2$ film 2 and which is held between low-resistivity polycrystalline Si wiring leads 3a, is irradiated with a laser 5 through an overlying passivation film 4 and thus turned into low resistivity and connected as illustrated in FIG. 2(b).

However, the method in which the wiring leads are connected in this manner has the following disadvantages:

(1) The laser irradiation is liable to damage the nearby substrate. Therefore, the layout requires a sufficient margin and results in a large area.

(2) Even with the large area, a satisfactorily high positional accuracy is needed for suppressing influence on the surrounding part in the case of the laser irradiation of the part to-be-connected. In order to perform processing at high speed in the case of mass production, a processing apparatus becomes considerably expensive. Moreover, locating a function element around the part to-be-connected is difficult from the standpoint of reliability.

(3) It is insufficient to use only the procedure of connection. The combined use with cutting is sometimes advantageous on the occupying area of a chip.

FIGS. 3(a) to 3(c) are views illustrating a problem in the case where a function element is arranged around the wiring lead to be cut or connected in the prior art. FIG. 3(a) is a plan view, and FIGS. 3(b) and 3(c) are views of section A–B and section C–D in FIG. 3(a), respectively. Numeral 7 indicates PSG (phosphosilicate glass), numeral 8 Si$_3$N$_4$ (silicon nitride), numeral 11 a first layer of Al wiring, and numeral 12 a second layer of Al wiring.

A Poly-Si (polycrystalline silicon) or Al wiring lead 3d, which is disposed on an Si substrate 1 with an SiO$_2$ film 2 intervening therebetween, is irradiated with a laser 5 from above the Si substrate 1, to cut the Poly-Si or Al wiring lead 3d or to connect the Poly-Si wiring lead 3d. Since, however, a processing apparatus bears a heavy burden when positioning the laser beam to the wiring part of 2–3 μm at high precision and performing processing at high speed, the size of the laser 5 to irradiate the wiring lead 3d is considerably larger than that of the wiring lead 3d in practical use. Then, in case of this prior-art example, function parts 16 located on both the sides of the wiring lead 3d are partly irradiated with the laser beam, and function parts 15 may be thermally affected. Therefore, in order to realize fast processing at the sacrifice of some precision, the function parts must be spaced sufficiently from the laser irradiation part to avoid damage. This inevitably makes the area of a chip large.

SUMMARY OF THE INVENTION

An object of the present invention is to eliminate the disadvantages of the prior arts described above and to provide a semiconductor integrated circuit device which allows an integrated circuit of high packaging density to be programmed at high accuracy, high speed and high reliability.

The present invention is a semiconductor integrated circuit device wherein, at the stage of processing a second layer of Al wiring, a part to be irradiated with a laser has no Al deposited therein and the outer sides thereof are covered with a second layer of Al film, so as to prevent the laser beam from invading undesired parts, whereby function parts are allowed to be arranged also around the wiring which needs to be subjected to programming such as cutting and connection by the laser, and the programming can be performed at high speed and at high precision without remarkably enhancing the function of the prior-art processing devices. Particularly in case of cutting a first layer of Al, the second layer of Al film is made at least two times as thick as the first layer of Al film by considering the machining threshold value of laser power, lest the second layer of masking Al should be removed down to its bottom even when the first layer of Al wiring has been cut.

BRIEF DESCRIPTION OF THE DRAWINGS

FIG. 3(a) is a plan view illustrating the problem of the laser cutting and connection in the prior art, FIG. 3(b) is a view of section A-B in FIG. 3(a), and FIG. 3(c) is a view of section C-D in FIG. 3(a);

FIG. 5(a) is a plan view showing another embodiment of the semiconductor integrated circuit device of the present invention, FIG. 5(b) is a view of section A-B in FIG. 5(a), and FIG. 5(c) is a view of section C-D in FIG. 5(a)

DETAILED DESCRIPTION OF THE PREFERRED EMBODIMENTS

Figure 1A:
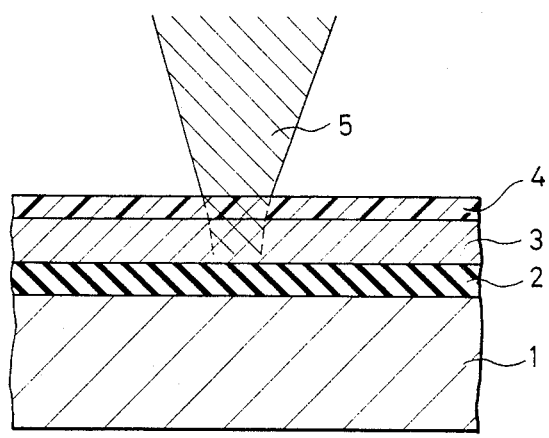
FIGS. 1(a) and 1(b) are views showing a prior-art example of the cutting of wiring by a laser.
Figure 1B:
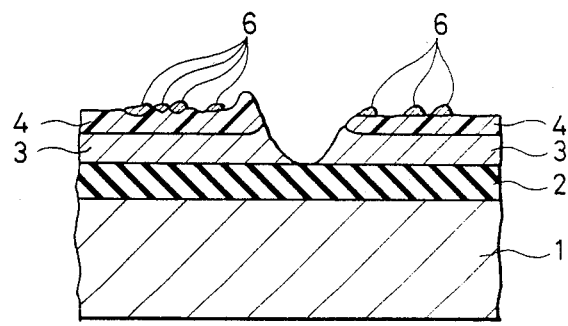
Figure 2A:
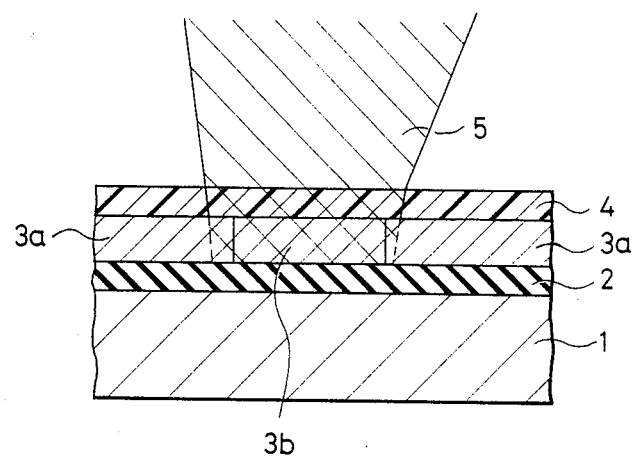
FIGS. 2(a) and 2(b) are views showing a prior-art example of the connection of wiring by a laser.
Figure 2B:
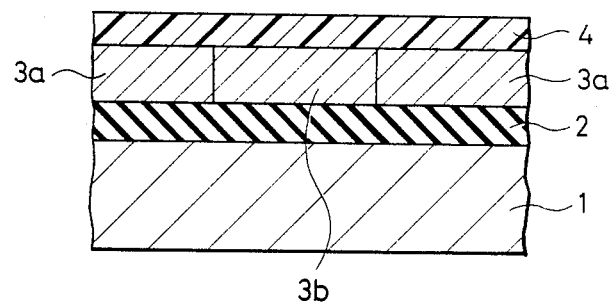

The present invention will be specifically described in conjunction with embodiments shown in the drawings.

Figure 4A:
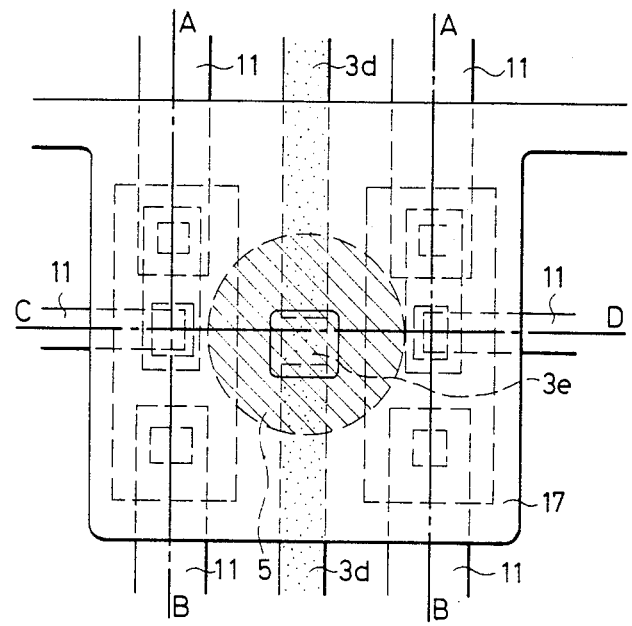
FIG. 4(a) is a plan view showing an embodiment of the semiconductor integrated circuit device of the present invention, FIG. 4(b) ia a view of section A-B in FIG. 4(a)
Figure 4B:
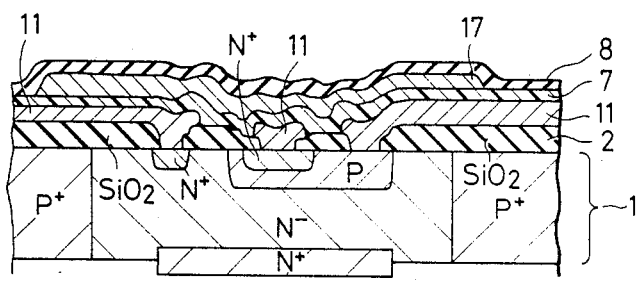
FIG. 4(c) is a view of section C-D in FIG. 4(a)
Figure 4C:
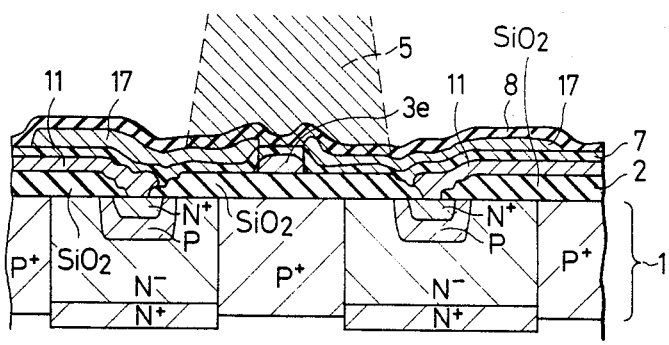

FIGS. 4(a), 4(b) and 4(c) show an embodiment of the present invention. FIG. 4(a) is a plan view, FIG. 4(b) is a view of section A-B in FIG. 4(a), and FIG. 4(c) is a view of section C-D in FIG. 4(a). A high-resistivity polycrystalline Si wiring lead 3e is fabricated which is electrically insulated from an Si substrate 1 by an $SiO_2$ film 2 and which is held between low-resistivity polycrystalline Si wiring leads 3d of sheet resistance of several tens of ohms/$\square$. A second layer 17 of Al film is formed on the wiring lead 3e with a PSG insulating film 7 intervening therebetween. The second layer of Al 17 has a window through which the high-resistivity Poly-Si wiring lead 3e of several gigaohms/$\square$ incuding its perimeter about 1 $\mu$m wide can be sufficiently seen, and which covers the perimeter of about 20 microns square. The high-resistivity Ply-Si wiring lead 3e is irradiated through the window of the second layer of Al film 17 with a pulse laser beam 5 by one to several hundred pulses; the pulse laser beam having a beam diameter of 10 $\mu$m, a positional accuracy of ±4 $\mu$m, a pulse width of several nano~for several tens of nanoseconds, a power density on the order of $10^5$–$10^7$ W/cm², and wavelengths of near-infrared to ultraviolet radiation (2500 Å – 1.2 $\mu$m) adapted to permeate through the PSG insulating film. Then, Phosphorus with which the low-resistivity Poly-Si wiring leads 3d on both the sides of the high-resistivity Poly-Si wiring lead 3e is doped, and Phosphorus in the overlying PSG layer diffuse into the high-resistivity polycrystalline Si, to lower its sheet resistance into $10$'–$10^3$ ohms/$\square$ and to change it from and insulating state into a conductive state circuit-wise.

At this time, the resistance value changes for every pulse of the laser irradiation. Therefore, the decrease of the resistance value may be monitored by erecting a whisker on a probing pad (not shown) on a chip, and the irradiation with the laser pulses may be stopped when a predetermined resistance value has been reached. In addition, the machining limit power density of an Al wiring lead approximately 1 $\mu$m thick is at least $5 \times 10^8$ W/cm². Therefore, the Al wiring lead is not machined, and the part covered with Al is not affected at all even when the laser has impinged thereon.

In this manner, the perimeter of the high-resistivity Poly-Si wiring lead 3e which is to have its resistance lowered by the laser irradiation is covered with the Al mask, whereby the damage of adjacent parts in the Si substrate 1 caused by the laser irradiation can be prevented. Accordingly, even when function regions are disposed in the adjacent parts, the high-resistivity polycrystalline silicon is allowed to be processed at a low positional accuracy of the laser irradiation. Therefore, it has become possible to raise the speed of the processing, and to make the integrated circuit still higher in density than in the prior arts.

Numeral 8 indicates an $Si_3N_4$ film.

FIGS. 5(a), 5(b) and 5(c) show another embodiment of the present invention. FIG. 5(a) is a plan view of the embodiment, FIG. 5(b) is a view of section A-B in FIG. 5(a), and FIG. 5(c) is a view of section C-D in FIG. 5(a). There is provided a low-resistivity Poly-Si wiring lead 3d of several tens of ohms/$\square$ which is electrically insulated from an Si substrate 1 by an $SiO_2$ film 2. When the low-resistivity Poly-Si wiring lead 3d to be cut is overlaid with second-layer Al films 18, 19a and 19b, having thicknesses of about 0.6–2 $\mu$m, in a manner to interpose a PSG insulating film 7 therebetween, it is exposed by several microns, and a mask of Al is simultaneously formed so as to cover the perimeter of the position to-be-cut of about 20 $\mu$m square with a left Al mask 19b, which covers the lower part of the wiring lead 3d and the left side of the middle part thereof to be cut and which is separate from a second layer of Al wiring lead 18, and a right Al mask 19a, which covers the upper part of the wiring lead 3d and the right side of the middle part thereof to be cut and which is separate from the second layer of Al wiring lead 18.

The Al mask 19a and 19b thus disposed are irradiated with a pulse laser beam 5 by one pulse from above; the pulse laser beam having a beam diameter of about 10 $\mu$m, a positional accuracy of ±3 $\mu$m, a pulse width of several nanoseconds–several tens of nanoseconds, and a power density on the order of $10^7$–$3 \times 10^8$ W/cm². Then, the Poly-Si wiring lead 3d exposed between the Al masks is instantly removed to end the cutting. If necessary, a protective coating is provided after the cutting of the wiring lead.

In this manner, the portion other than the place to be cut is covered with the two separate Al masks 19a and 19b, whereby the required minimum range to be cut can be effectively irradiated with the laser, and the other portion is protected by the separate Al masks 19a, 19b and is not affected at all. Even in a case where the cut Poly-Si wiring lead 3d has been partly short-circuited to the left Al mask 19b or/and the right Al mask 19a, the short circuit poses no problem because each of the Al masks 19a and 19b does not have any conduction to another part.

As a result, it has become possible to perform the required wiring lead cutting processing at a low positional accuracy of the laser irradiation, and to realize fast production. Moreover, it has become possible to position function elements around the part to-be-cut, and to render the packaging density of an integrated circuit higher than in the prior arts.

Also in a case where the Poly-Si wiring lead 3d in FIGS. 5(a), 5(b) and 5(c) is applied to a first layer of Al wiring, similar right and left Al masks 19a, 19b are provided, the thickness of which is made at least two times that of the first layer of Al wiring. In this case, when the Al wiring lead 3d to be fabricated simultaneously with the first layer of Al 11 is 1 μm thick, the second-layer Al wiring leads 18, 19a and 19b to be fabricated simultaneously with the Al masks 19a and 19b are made at least 2 μm thick so as to have thicknesses not less than double the thickness of the first layer of Al 11. The place to be cut is irradiated with the pulse laser beam 5 from above the Al masks, the laser beam having a beam diameter of about 10 μm, a positional accuracy of ±3 μm, a pulse width of several nanoseconds–several tens of nanoseconds, and a power density on the order of $5 \times 10^8$–$10^9$ W/cm². Then, the Al wiring lead 3d is removed instantly. Even when the peripheral parts of the Al masks have been somewhat damaged, they do not penetrate through the underlying part to affect function parts within the Si substrate 1. In addition, even when the cut part of the Al wiring lead has short-circuited to the right or left Al mask 19a, 19b, no problem occurs because the mask portion has no conduction to another part. If necessary, a protective cover is provided after the cutting of the wiring lead.

In this way, it has become possible to perform the required Al wiring cutting processing at a comparatively low accuracy, and to realize fast production. Moreover, it has become possible to position function elements around the part to-be-cut, and to render the packaging density of an integrated circuit higher than in the prior art.

Figure 6:
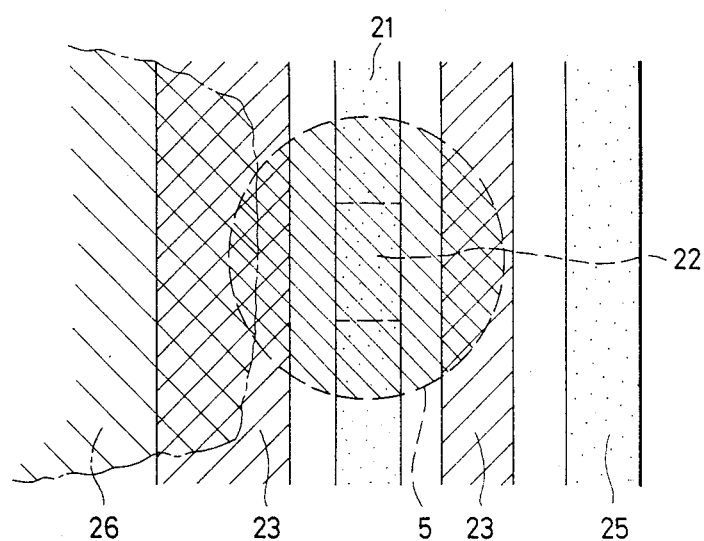
FIG. 6 is a view showing still another embodiment of the semiconductor integrated circuit device of the present invention.

FIG. 6 shows another embodiment of the present invention. Near a program part 22 of a programming wiring lead 21, Al layers 23 such as Al wiring leads are arranged in a manner to hold the program part 22 therebetween. In a case where the programming wiring lead 21 is of Poly-Si, the thickness of each of the Al layers on both the sides is made approximately 0.5–2 μm. In a case where the programming wiring lead 21 is of Al, Al layers are provided on both sides which are at least two times as thick as the programming Al. Assuming that the width of each lead and the interval of the leads are 2 μm, even when a laser beam 5 having a spot diameter of 8 μm is used, this laser beam impinges on the adjacent programming wiring lead 25 in only a case where a positional deviation of at least 3 μm has taken place. In addition, when the width of each of the Al wiring leads 23 on both the sides is made at least 4 μm, a function element 26 can be brought as close to the programming wiring lead 21 as 2 μm by causing a part thereof to get under the Al wiring lead 23, and it can be brought as close as 3 μm even when a safety width of 1 μm is set.

When the laser beam for irradiation instead of being circular is made a rectangular beam based on the projection of a rectangular opening, the range of the laser irradiation becomes preciser. Even with the same irradiated size, therefore, the function element can be similarly brought close.

As set forth above, the present invention consists in a semiconductor integrated circuit device in which, in the process of a second layer of Al, a required protective mask is disposed around a part where a wiring lead is to be cut or connected. Therefore, the following functional effects are attained:

(1) An irradiating laser beam for the cutting or connection can be used in a large size which is not restricted by a pattern size.
(2) The irradiating positional accuracy of the beam may be within ±3 μm for pattern sizes of at most 5 μm, and a high accuracy of ±1 μm as in the prior art is not required. Therefore table speed can be raised, and the speed of the cutting or connecting processing can be sharply increased.
(3) Function elements are allowed to be arranged around a wiring lead to-be-cut or -connected, and the packaging density of an integrated circuit can be made higher than in the prior art.

We claim:
1. A semiconductor integrated circuit device comprising:
a semiconductor body;
a lower insulating film disposed on the semiconductor body;
a circuit programming wiring layer disposed on the lower insulating film;
an upper insulating film disposed on said circuit programming wiring layer;
a light shielding protective mask material disposed on said upper insulating film and above said circuit programming wiring layer except for a program part thereof which is to be eliminated by a light source used for programming said program part, the protective mask material being disposed adjacent an upper wiring portion, said protective mask material being divided into at least two electrically conductive parts which are separated and electrically insulated from each other with a boundary at a window of said program part of said wiring layer, said divided parts being also electrically insulated from said upper wiring portion; and
a film disposed on said protective mask material and the upper wiring portion and the upper insulating film.

2. A semiconductor integrated circuit device as in claim 1, which in said circuit programming wiring layer comprises a metallization layer.

3. A semiconductor integrated circuit device as in claim 2, in which said metallization layer comprises a poly-si layer.

* * * * *